(12) United States Patent
Strang

(10) Patent No.: US 7,384,876 B2
(45) Date of Patent: Jun. 10, 2008

(54) METHOD AND APPARATUS FOR DETERMINING CONSUMABLE LIFETIME

(75) Inventor: Eric J. Strang, Chandler, AZ (US)

(73) Assignee: Tokyo Electron Limited, Tokyo (JP)

( * ) Notice: Subject to any disclaimer, the term of this patent is extended or adjusted under 35 U.S.C. 154(b) by 338 days.

(21) Appl. No.: 10/539,705

(22) PCT Filed: Dec. 19, 2003

(86) PCT No.: PCT/US03/37092

§ 371 (c)(1),
(2), (4) Date: Jan. 4, 2006

(87) PCT Pub. No.: WO2004/061888

PCT Pub. Date: Jul. 22, 2004

(65) Prior Publication Data

US 2006/0138082 A1 Jun. 29, 2006

Related U.S. Application Data

(60) Provisional application No. 60/434,657, filed on Dec. 20, 2002.

(51) Int. Cl.
*H01L 21/302* (2006.01)
(52) U.S. Cl. .................... 438/714; 438/5; 438/710; 438/711; 118/715; 156/345.3
(58) Field of Classification Search .................. 438/5, 438/9, 706, 710, 711, 712, 714; 118/50.715, 118/723; 156/345.3, 33, 34, 39
See application file for complete search history.

(56) References Cited

U.S. PATENT DOCUMENTS

| 5,350,480 A | * | 9/1994 | Gray | 156/345.26 |
| 6,755,932 B2 | * | 6/2004 | Masuda et al. | 156/345.24 |
| 2002/0014308 A1 | * | 2/2002 | Sawayama | 156/345 |

* cited by examiner

*Primary Examiner*—Lan Vinh
(74) *Attorney, Agent, or Firm*—Oblon, Spivak, McClelland, Maier & Neustadt, P.C.

(57) ABSTRACT

A plasma processing device comprising a gas injection system is described, wherein the gas injection system comprises a gas injection assembly body, a consumable gas inject plate coupled to the gas injection assembly body, and a pressure sensor coupled to a gas injection plenum formed by the gas injection system body and the consumable gas inject plate. The gas injection system is configured to receive a process gas from at least one mass flow controller and distribute the process gas to the processing region within the plasma processing device, and the pressure sensor is configured to measure a gas injection pressure within the gas injection plenum. A controller, coupled to the pressure sensor, is configured to receive a signal from the pressure sensor and to determine a state of the consumable gas inject plate based upon the signal. A method of determining the state of the consumable gas inject plate comprises: measuring a change in the gas injection pressure associated with either a change in the process gas mass flow rate or the processing pressure; determining a response time for the change in pressure; and comparing the response time during erosion to a response time during no erosion.

8 Claims, 11 Drawing Sheets

METHOD AND APPARATUS FOR DETERMINING CONSUMABLE LIFETIME

CROSS-REFERENCE TO RELATED APPLICATIONS

This application claims priority and is related to U.S. Provisional Application Ser. No. 60/434,657, filed on Dec. 20, 2002. The contents of these applications are incorporated herein by reference.

FIELD OF THE INVENTION

The present invention relates to a method and apparatus for determining consumable lifetime in an erosive environment, and more particularly to a method and apparatus for determining the lifetime of a consumable gas injection component.

BACKGROUND OF THE INVENTION

In semiconductor manufacturing, plasma is often employed to create and assist surface chemistry within a plasma reactor necessary to remove material from and deposit material to a substrate. In general, plasma is formed within the plasma reactor under vacuum conditions by heating electrons to energies sufficient to sustain ionizing collisions with a supplied process gas. Moreover, the heated electrons can have energy sufficient to sustain dissociative collisions and, therefore, a specific set of gases under predetermined conditions (e.g., chamber pressure, gas flow rate, etc.) are chosen to produce a population of charged species and chemically reactive species suitable to the particular process being performed within the chamber (e.g., etching processes where materials are removed from the substrate or deposition processes where materials are added to the substrate). One pre-requisite to ensuring a uniform process includes a uniform injection of process gas to the plasma chemistry above the substrate. FIG. 1 presents a showerhead-type gas injection system 1 comprising a gas injection assembly body 10, a gas inject plate 12, and optionally one or more baffle plates 14 installed within gas injection plenum 16. In general, the gas injection assembly body 10, the gas inject plate 12, and the one or more baffle plates are fabricated from aluminum. The process gas can be supplied to the gas injection plenum 16 via a mass flow controller 30 and/or pressure regulator 32 In order to minimize the damage sustained by exposure to the processing plasma, a consumable or replaceable component can be inserted within the processing chamber to protect the surfaces of more valuable components that would impose greater costs during frequent replacement. Therefore, the gas injection system 1 depicted in FIG. 1 can further comprise a consumable gas inject plate 20. The consumable gas inject plate 20 can be fabricated from materials such as silicon, quartz, sapphire, alumina, carbon, silicon carbide, etc. In general, it is desirable to select surface materials that during erosion minimize the introduction of unwanted contaminants, impurities, etc. to the processing plasma and possibly to the devices formed on the substrate. As a result of their consumable nature, the erosion of exposed components in the plasma processing system can lead to a gradual degradation of the plasma processing performance and ultimately to complete failure of the system. Therefore, it is important to properly maintain these components. For instance, these consumables or replaceable components are typically considered as part of a process kit that is frequently maintained during system cleaning. In manufacturing environments, consumable components, such as the consumable gas inject plate 20, are replaced during pre-determined maintenance intervals, which are often dictated by a measure of usage such as the number of RF hours. Since the measure of usage is determined conservatively, consumable components can be replaced before the end of their lifetime, hence, leading to increased manufacturing costs, downtime, etc.

SUMMARY OF THE INVENTION

A method and apparatus are described for determining consumable lifetime, and particularly a method and apparatus for determining a lifetime of a consumable gas injection component.

More particularly, a gas injection system in a plasma processing device is described comprising: a gas injection assembly body configured to receive a process gas from one or more mass flow controllers; a consumable gas inject plate coupled to the gas injection assembly body, the consumable gas inject plate comprising one or more orifices to distribute the process gas to the plasma processing device; a pressure sensor coupled to the gas injection assembly body and configured to measure a gas injection pressure within a gas injection plenum formed by the gas injection assembly body and the consumable gas inject plate; and a controller coupled to the pressure sensor and configured to determine a state of the consumable gas inject plate from a change in the gas injection pressure.

Additionally, a method of determining the state of a gas injection system in a plasma processing device comprises: changing a process parameter in the plasma processing device to affect a change of a gas injection pressure in the gas injection; measuring a response time corresponding to a change of the gas injection pressure using the pressure sensor, wherein the response time corresponds to a first time duration when the consumable gas inject plate has not been eroded and the response time corresponds to a second time duration when the consumable gas inject plate has been eroded; and comparing the response time to at least one of the first and second time durations in order to determine the state of the gas injection system.

BRIEF DESCRIPTION OF THE DRAWINGS

These and other advantages of the invention will become more apparent and more readily appreciated from the following detailed description of the exemplary embodiments of the invention taken in conjunction with the accompanying drawings, where.

DETAILED DESCRIPTION OF AN EMBODIMENT

Figure 1:
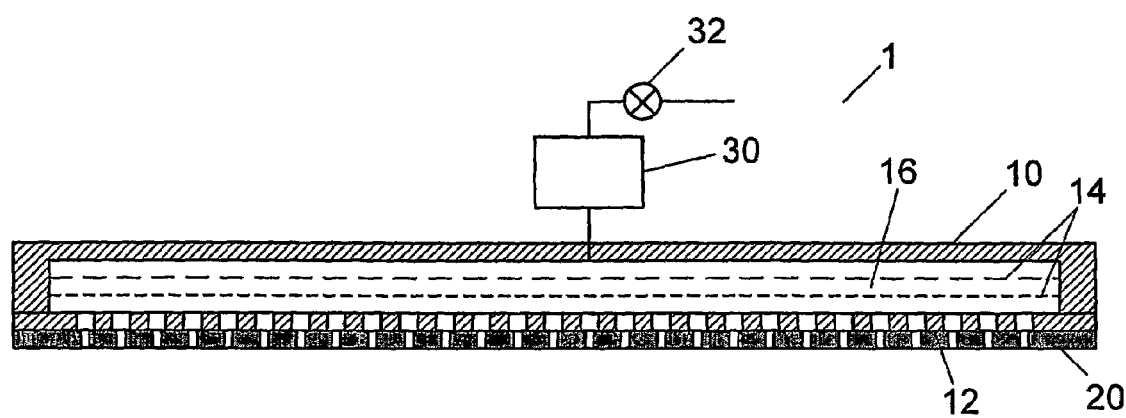
FIG. 1 shows a schematic representation of a typical gas injection system for a plasma processing device.
Figure 2:
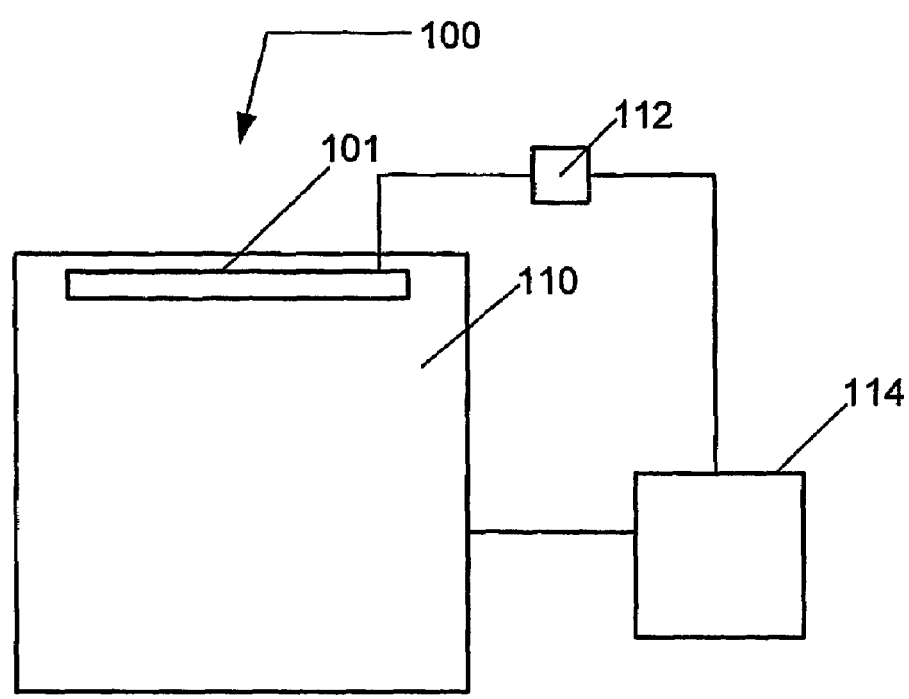
FIG. 2 shows a block diagram of a plasma processing device in accordance with an embodiment of the present invention.

A plasma processing device 100 is depicted in FIG. 2 comprising a plasma processing chamber 110, a gas injection system 101 coupled to the plasma processing chamber 110, a diagnostic system 112 coupled to the gas injection system 101 of the plasma processing chamber 110, and a controller 114 coupled to the diagnostic system 112 and the plasma processing chamber 110. The controller 114 is configured to receive one or more signals from the diagnostic system 112, process the one or more signals, and determine a status of the gas injection system 101 and its consumable components. In the illustrated embodiment, plasma processing device 100, depicted in FIG. 2, utilizes a plasma for material processing. Desirably, plasma processing device 100 comprises an etch chamber.

Figure 3:
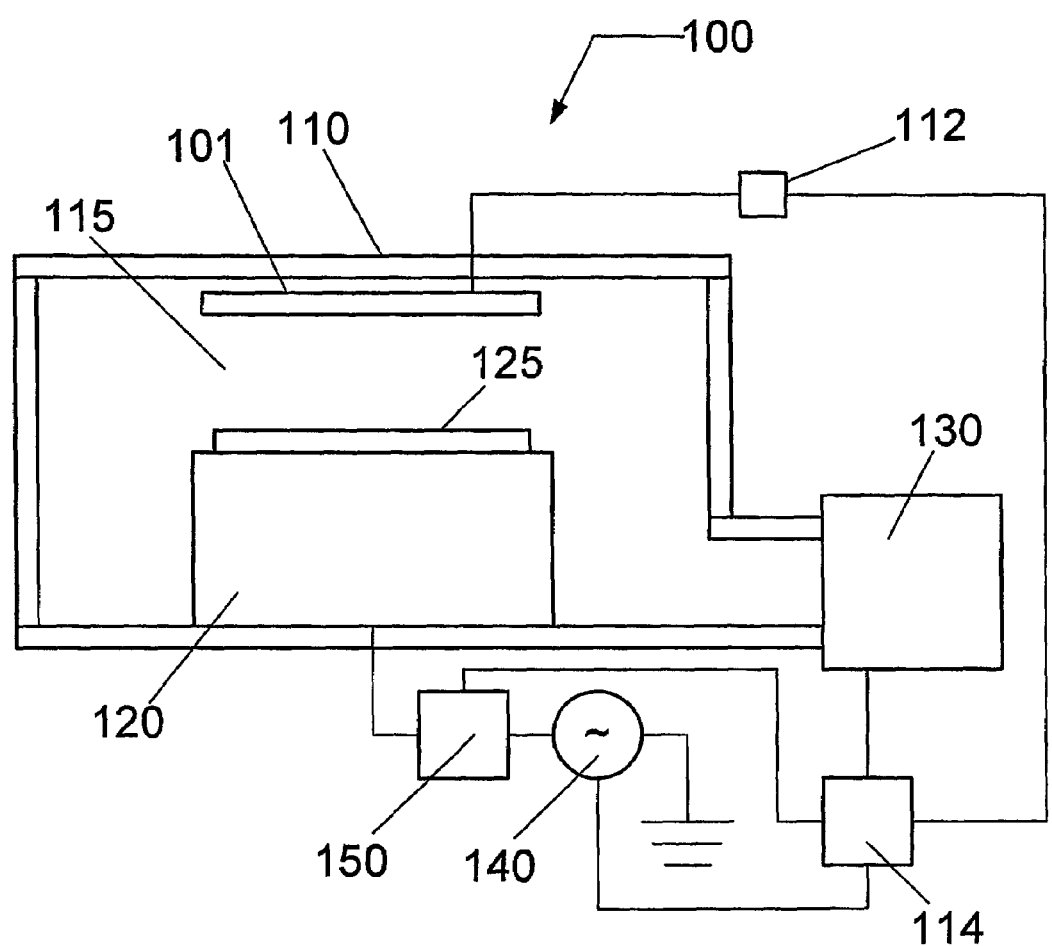
FIG. 3 shows a block diagram of a plasma processing device in accordance with another embodiment of the present invention.

According to the illustrated embodiment depicted in FIG. 3, plasma processing device 100 can comprise plasma processing chamber 110, gas injection system 101, substrate holder 120, upon which a substrate 125 to be processed is affixed, and vacuum pumping system 130. Substrate 125 can be, for example, a semiconductor substrate, a wafer or a liquid crystal display. Plasma processing chamber 110 can be, for example, configured to facilitate the generation of plasma in processing region 115 adjacent a surface of substrate 125. An ionizable gas or mixture of gases is introduced via gas injection system 101 and the process pressure is adjusted. Additionally, a control mechanism (not shown) can be used to throttle the vacuum pumping system 130. Desirably, plasma is utilized to create materials specific to a predetermined materials process, and/or to aid the removal of material from the exposed surfaces of substrate 125. The plasma processing device 100 can be configured to process 200 mm substrates, 300 mm substrates, or larger.

Substrate 125 can be, for example, affixed to the substrate holder 120 via an electrostatic clamping system. Furthermore, substrate holder 120 can, for example, further include a cooling system including a re-circulating coolant flow that receives heat from substrate holder 120 and transfers heat to a heat exchanger system (not shown), or when heating, transfers heat from the heat exchanger system. Moreover, gas can, for example, be delivered to the back-side of substrate 125 via a backside gas system to improve the gas-gap thermal conductance between substrate 125 and substrate holder 120. Such a system can be utilized when temperature control of the substrate is required at elevated or reduced temperatures. For example, the backside gas system can comprise a two-zone gas distribution system, wherein the helium gas gap pressure can be independently varied between the center and the edge of substrate 125. In other embodiments, heating/cooling elements, such as resistive heating elements, or thermoelectric heaters/coolers can be included in the substrate holder 120, as well as the chamber wall of the plasma processing chamber 110 and any other component within the plasma processing device 100.

In the illustrated embodiment, shown in FIG. 3, substrate holder 120 can comprise an electrode through which RF power is coupled to the processing plasma in process space 115. For example, substrate holder 120 can be electrically biased at a RF voltage via the transmission of RF power from a RF generator 140 through an impedance match network 150 to substrate holder 120. The RF bias can serve to heat electrons to form and maintain plasma. In this configuration, the system can operate as a reactive ion etch (RIE) reactor, wherein the chamber and upper gas injection electrode serve as ground surfaces. A typical frequency for the RF bias can range from 0.1 MHz to 100 MHz. RF systems for plasma processing are well known to those skilled in the art.

Alternately, RF power is applied to the substrate holder electrode at multiple frequencies. Furthermore, impedance match network 150 serves to maximize the transfer of RF power to plasma in plasma processing chamber 110 by minimizing the reflected power. Match network topologies (e.g. L-type, π-type, T-type, etc.) and automatic control methods are well known to those skilled in the art.

Vacuum pump system 130 can, for example, include a turbo-molecular vacuum pump (TMP) capable of a pumping speed up to 5000 liters per second (and greater) and a gate valve for throttling the chamber pressure. In conventional plasma processing devices utilized for dry plasma etch, a 1000 to 3000 liter per second TMP is generally employed. TMPs are useful for low pressure processing, typically less than 50 mTorr. At higher pressures, the TMP pumping speed falls off dramatically. For high pressure processing (i.e., greater than 100 mTorr), a mechanical booster pump and dry roughing pump can be used. Furthermore, a device for monitoring chamber pressure (not shown) can be coupled to the plasma processing chamber 110. The pressure measuring device can be, for example, a Type 628B Baratron absolute capacitance manometer commercially available from MKS Instruments, Inc. (Andover, Mass.).

Controller 114 comprises a microprocessor, memory, and a digital I/O port capable of generating control voltages sufficient to communicate and activate inputs to plasma processing device 100 as well as monitor outputs from plasma processing device 100. Moreover, controller 114 can be coupled to and can exchange information with RF generator 140, impedance match network 150, the gas injection system 101, diagnostic system 112, vacuum pump system 130, as well as the backside gas delivery system (not shown), the substrate/substrate holder temperature measurement system (not shown), and the electrostatic clamping system (not shown). For example, a program stored in the memory can be utilized to activate the inputs to the aforementioned components of plasma processing device 100 according to a process. In addition, controller 114 can be configured to receive one or more signals from the diagnostic system 112, process the one or more signals, and determine a state of the gas injection system 101 and its consumable components. One example of controller 114 is a DELL PRECISION WORKSTATION 610™, available from Dell Corporation, Austin, Tex.

Figure 4:
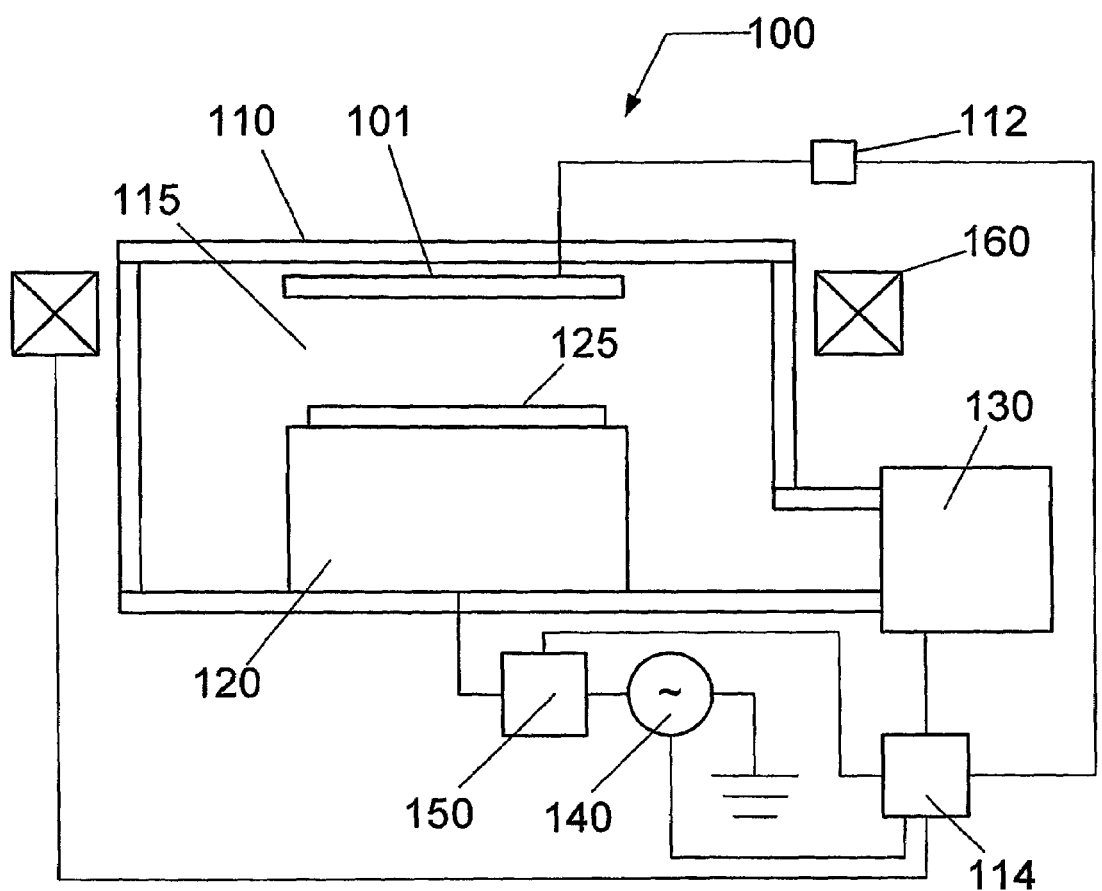
FIG. 4 shows a block diagram of a plasma processing device in accordance with another embodiment of the present invention.

In the illustrated embodiment, shown in FIG. 4, the plasma processing device 100 can, for example, further comprise either a stationary, or mechanically or electrically rotating magnetic field system 160, in order to potentially increase plasma density and/or improve plasma processing uniformity, in addition to those components described with reference to FIG. 2 and FIG. 3. Moreover, controller 114 can be coupled to magnetic field system 160 in order to regulate the speed of rotation and field strength. The design and implementation of a rotating magnetic field is well known to those skilled in the art.

Figure 5:
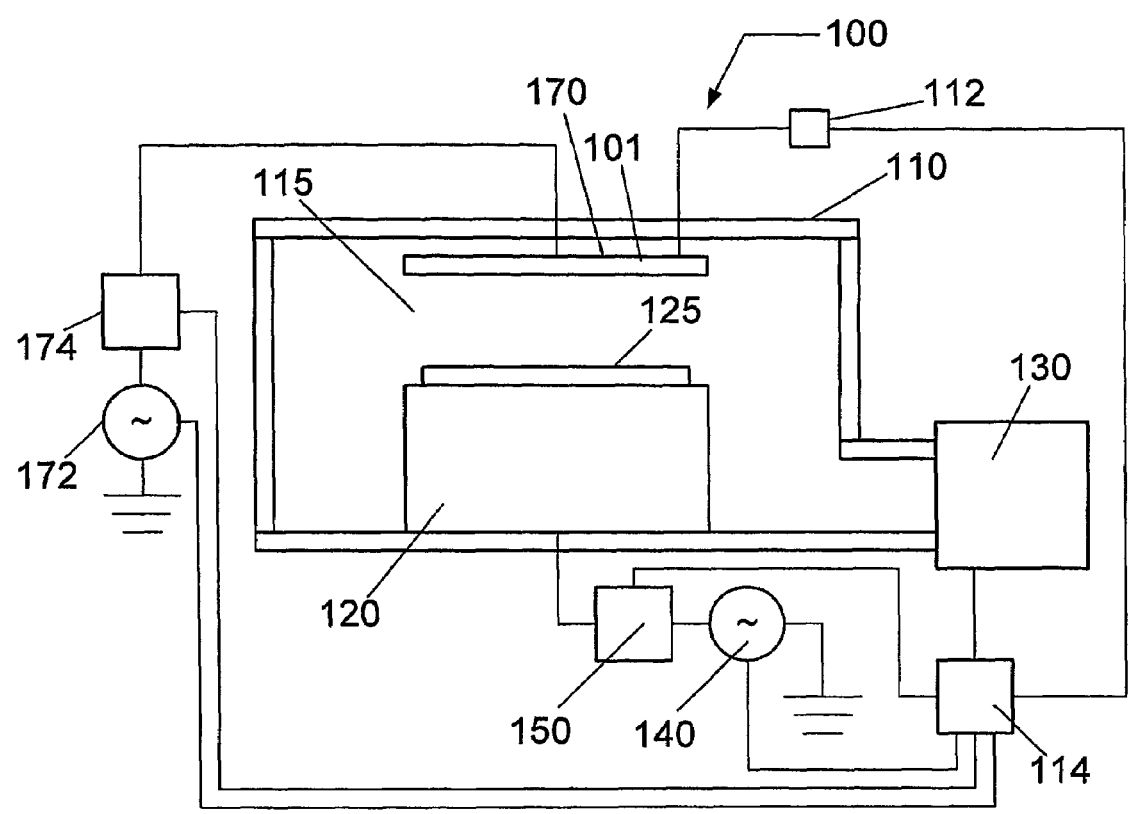
FIG. 5 shows a block diagram of a plasma processing device in accordance with another embodiment of the present invention.

In the illustrated embodiment, shown in FIG. 5, the plasma processing device 100 of FIG. 2 and FIG. 3 can, for example, further comprise an upper electrode 170 to which RF power can be coupled from RF generator 172 through impedance match network 174. A typical frequency for the application of RF power to the upper electrode can range from 0.1 MHz to 200 MHz. Additionally, a typical frequency for the application of power to the lower electrode can range from 0.1 MHz to 100 MHz. Moreover, controller 114 is coupled to RF generator 172 and impedance match network 174 in order to control the application of RF power to upper electrode 170. The design and implementation of an upper electrode is well known to those skilled in the art.

Figure 6:
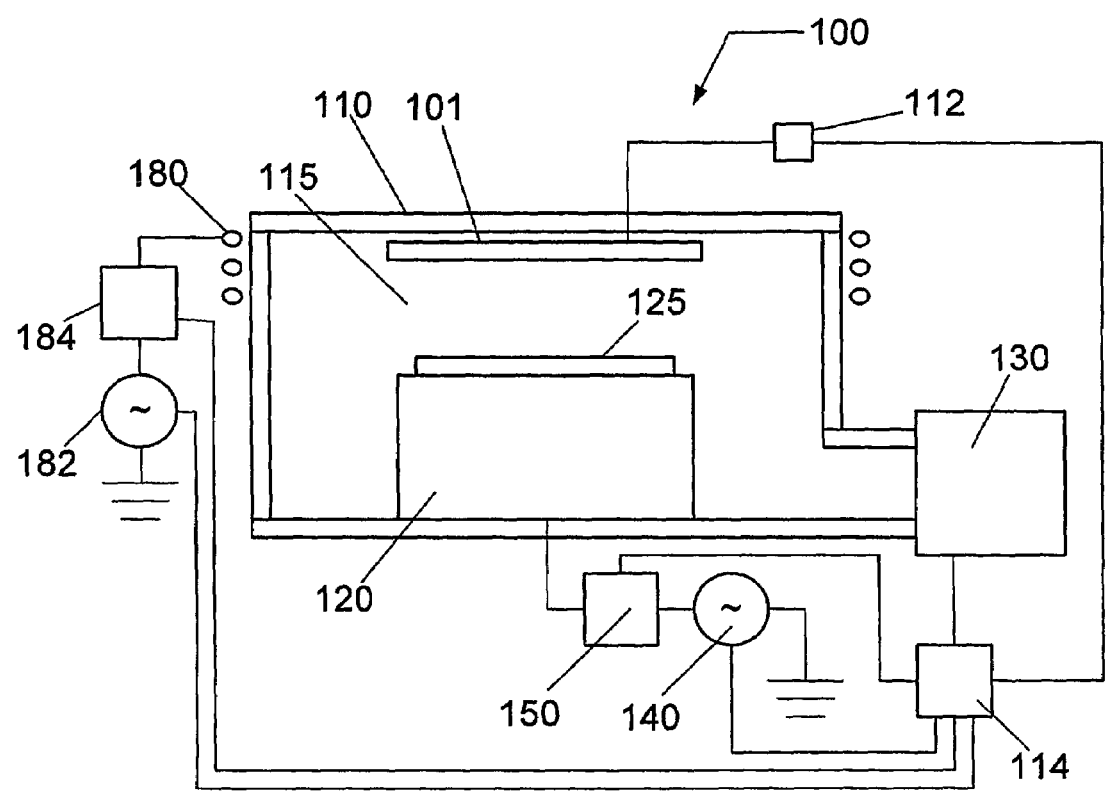
FIG. 6 shows a block diagram of a plasma processing device in accordance with another embodiment of the present invention.

In the illustrated embodiment, shown in FIG. 6, the plasma processing system of FIG. 3 can, for example, further comprise an inductive coil 180 to which RF power is coupled via RF generator 182 through impedance match network 184. RF power is inductively coupled from inductive coil 180 through dielectric window (not shown) to plasma processing region 115. A typical frequency for the application of RF power to the inductive coil 180 can range from 10 MHz to 100 MHz. Similarly, a typical frequency for the application of power to the chuck electrode can range from 0.1 MHz to 100 MHz. In addition, a slotted Faraday shield (not shown) can be employed to reduce capacitive coupling between the inductive coil 180 and plasma. Moreover, controller 114 is coupled to RF generator 182 and impedance match network 184 in order to control the application of power to inductive coil 180. In an alternate embodiment, inductive coil 180 can be a "spiral" coil or "pancake" coil in communication with the plasma processing region 115 from above as in a transformer coupled plasma (TCP) reactor. The design and implementation of an inductively coupled plasma (ICP) source, or transformer coupled plasma (TCP) source, is well known to those skilled in the art.

Alternately, the plasma can be formed using electron cyclotron resonance (ECR). In yet another embodiment, the plasma is formed from the launching of a Helicon wave. In yet another embodiment, the plasma is formed from a propagating surface wave. Each plasma source described above is well known to those skilled in the art.

Figure 7A:
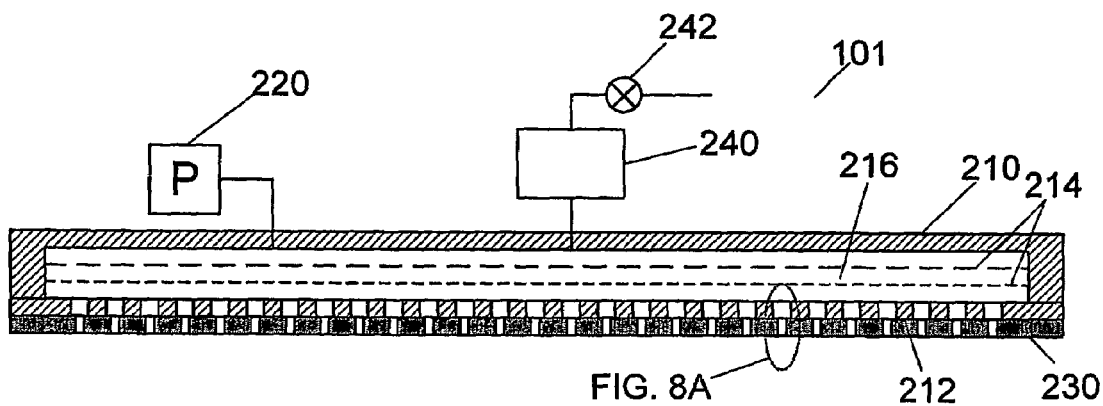
FIG. 7A shows a schematic representation of a gas injection system for a plasma processing device in accordance with another embodiment of the present invention.

Referring now to FIG. 7A, the gas injection system 101 is presented in greater detail. Gas injection system 101 comprises a gas injection assembly body 210, a gas inject plate 212, optionally one or more baffle plates 214 may be installed within gas injection plenum 216, and a pressure sensor 220 coupled to the gas injection plenum 216. In general, the gas injection assembly body 210, the gas inject plate 212, and the one or more baffle plates 214 can, for example, be fabricated from aluminum, or similar material. However, in order to minimize the damage sustained by exposure to a processing plasma, a consumable or replaceable component can be inserted within the processing chamber to protect the surfaces of more valuable components that would impose greater costs during frequent replacement. For example, the gas injection system 101, depicted in FIG. 7A, can further comprise a consumable component such as gas inject plate 230. The consumable gas inject plate 230 can be fabricated from materials such as silicon, quartz, sapphire, alumina, carbon, silicon carbide, anodized aluminum, aluminum coated with polyimide, aluminum coated with Teflon, and spray coated aluminum. For example, a spray coating can comprise at least one of $Al_2O_3$ and $Y_2O_3$. In another embodiment, the spray coated layer comprises at least one of a III-column element (column III of periodic table) and a Lanthanon element. In another embodiment, the III-column element comprises at least one of Yttrium, Scandium, and Lanthanum. In another embodiment, the Lanthanon element comprises at least one of Cerium, Dysprosium, and Europium. In another embodiment, the compound forming the spray coated layer comprises at least one of Yttria ($Y_2O_3$), $Sc_2O_3$, $Sc_2F_3$, $YF_3$, $La_2O_3$, $CeO_2$, $Eu_2O_3$, and $DyO_3$. In general, it is desirable to select surface materials that, during erosion, minimize the introduction of unwanted contaminants, impurities, etc. to the processing plasma and possibly to the devices formed on the substrate.

The pressure sensor 220 can, for example, be a Type 628B Baratron absolute capacitance manometer commercially available from MKS Instruments, Inc. (Andover, Mass.). As shown in FIG. 2, gas injection system 101 further comprises one or more mass flow controllers 240 and pressure regulators (or valves) 242 coupled to the gas injection assembly body 210 in order to supply a process gas or mixture of gases to the gas injection plenum 216.

Figure 7B:
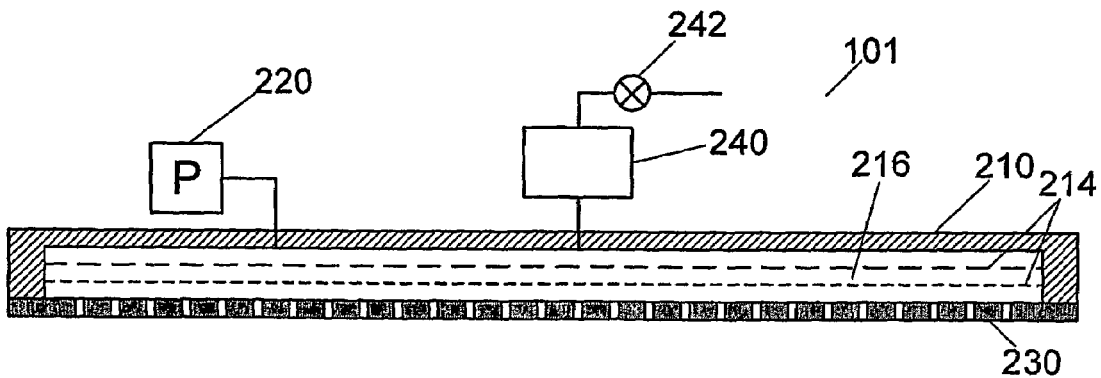
FIG. 7B shows a schematic representation of a gas injection system for a plasma processing device in accordance with another embodiment of the present invention.

Alternately, as shown in FIG. 7B, gas injection system 101 does not include gas inject plate 212, and consumable gas inject plate 230 can couple directly to the gas injection assembly body 210.

Figures 8A, 8B:
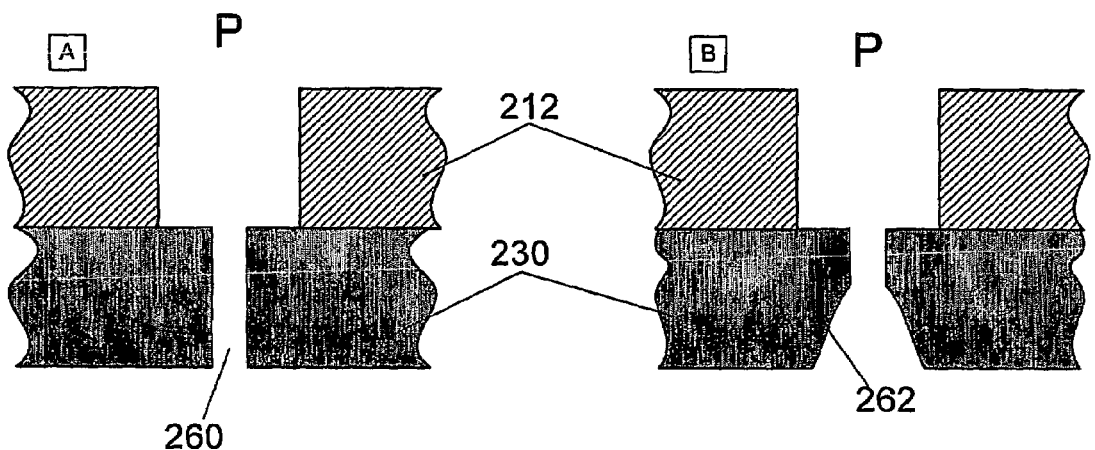
FIGS. 8A and 8B show simplified schematic diagrams of a non-eroded and an eroded orifice, respectively, in a gas injection system in accordance with another embodiment of the present invention.

FIG. 8A depicts a cross-section of a non-eroded orifice 260 extending through gas inject plate 212. FIG. 8B depicts the same orifice 260 after it has been eroded during processing. Before processing, the orifice(s) 260 extending through consumable gas inject plate 230 have yet to be exposed to plasma and, therefore, are not yet eroded. However, after significant processing, the erosion of the consumable gas inject plate 230, particularly proximate the orifice exit(s), affects substantial changes to the orifice diameter 262 (cross-section) as depicted in FIG. 8B. Typically, the orifice diameter 262 at the exit is drastically enlarged and the orifice length is shortened. For example, an orifice with length 5 mm and diameter 0.5 mm (i.e. aspect ratio of 10) formed within a silicon plate can be eroded to the extent shown in FIG. 8B within approximately 250 RF hours.

Due to the change in orifice length and diameter, the flow conductance C of the orifice(s) 260 changes predominantly in inverse proportion to the length and directly proportional to the diameter to third power for a free molecular flow and to the fourth power for a continuum flow. Therefore, during any change in processing pressure or mass flow rate, the response of the pressure P in the gas injection plenum 216 depends primarily upon the volume of the gas injection plenum 216 (fixed) and the net conductance of the orifice(s) 260 in the consumable gas inject plate 230.

Figure 8C:
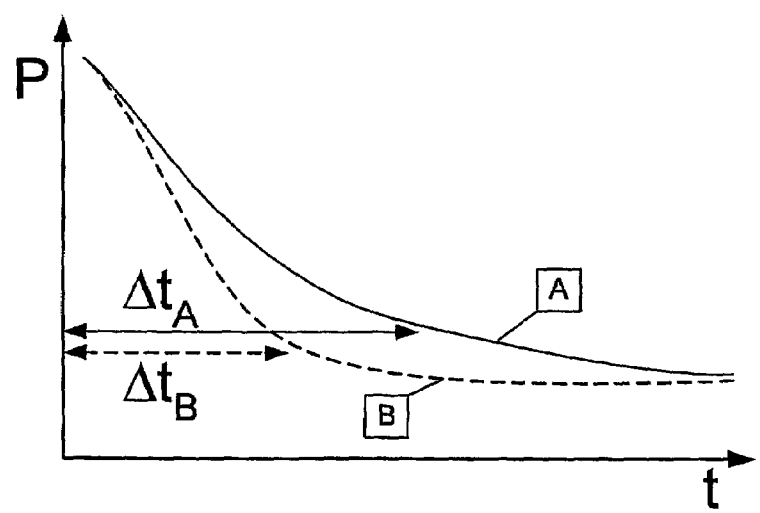
FIG. 8C shows a schematic diagram of a response curve for a measurement system coupled to a gas injection system in accordance with an embodiment of the present invention.

For example, during vacuum pump-down following wafer exchange with the transfer system (not shown) and preceding the initiation of a process gas flow rate, the vacuum pressure within the processing system is reduced (possibly to a base pressure) and, subsequently, the gas injection plenum pressure P is reduced, however, following a delay Δt. FIG. 8C presents an exemplary time trace depicting the response of the pressure P measured using the pressure sensor coupled to the gas injection plenum 216 during a change in processing pressure. In the case where the orifice(s) 260 has eroded (i.e. during an eroded state) and the flow conductance has subsequently increased, the response time, or delay, decreases from $\Delta t_A$ to $\Delta t_B$. For instance, with a change in chamber (processing) pressure or mass flow rate, the response time for 300-0.5 mm diameter, 10 mm long orifices coupled to a gas injection plenum with height 25.4 mm and diameter 300 mm is approximately 5 seconds. The change in response time, or delay, can be correlated with the state of the consumable inject plate 230. For example, when the time response, or delay, falls below a pre-determined threshold, then it is time to replace the consumable gas inject plate and an operator is notified.

Figure 9A:
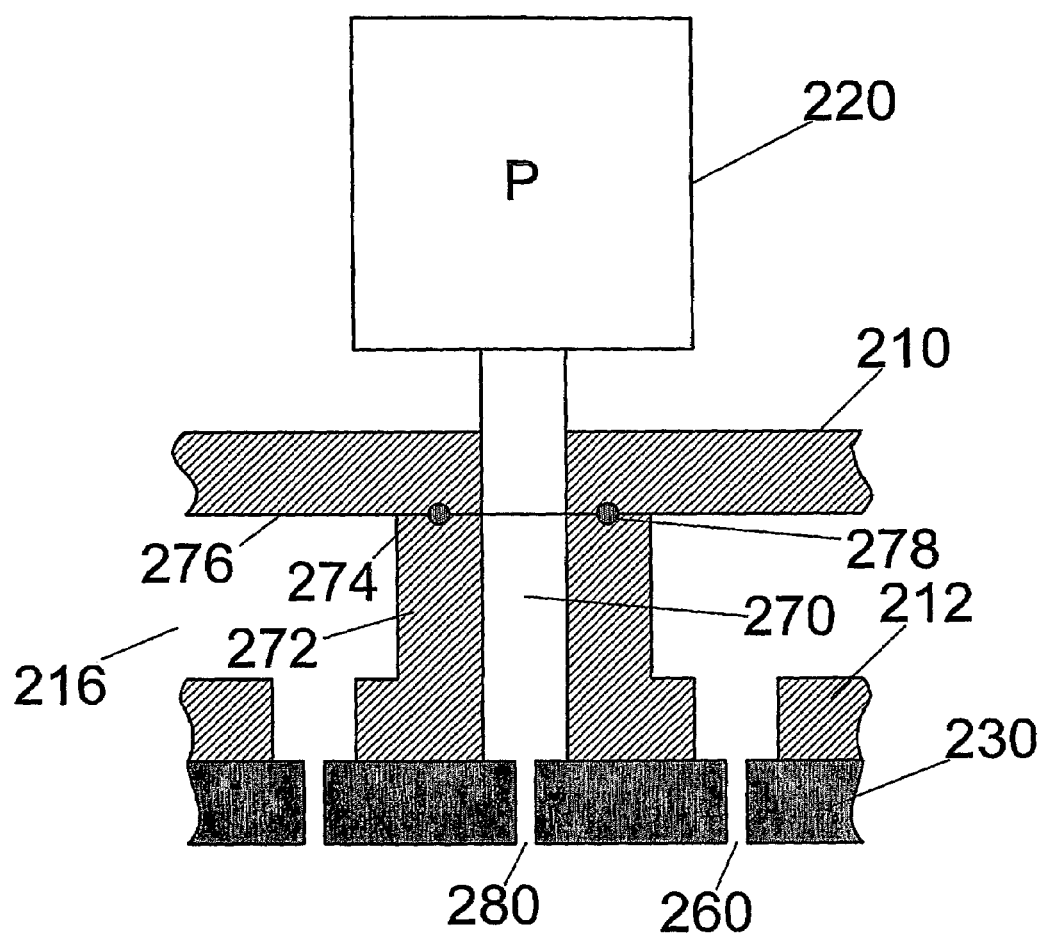
FIG. 9A shows another schematic representation of a gas injection system for a plasma processing device in accordance with an embodiment of the present invention.
Figure 9B:
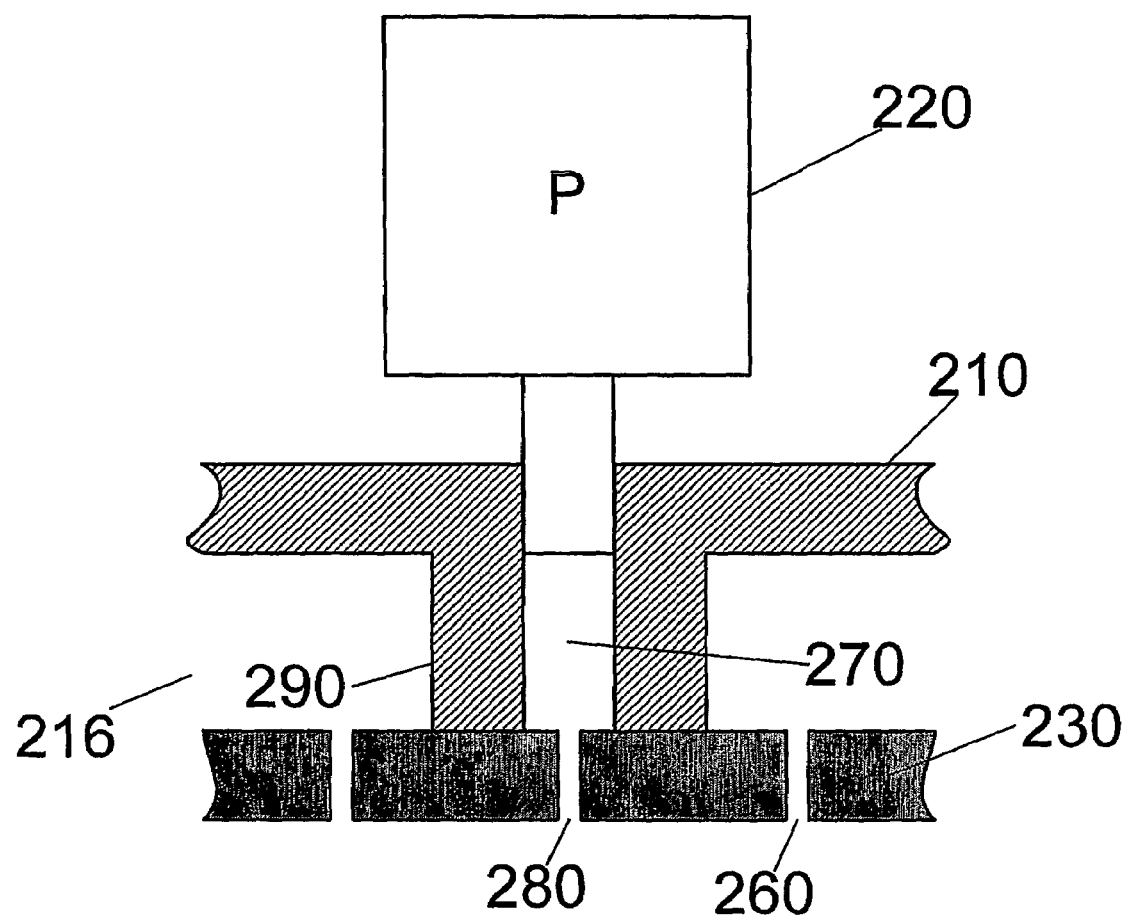
FIG. 9B shows another schematic representation of a gas injection system for a plasma processing device in accordance with an embodiment of the present invention.

In an alternate embodiment, FIGS. 9A and 9B present a gas injection system 101 similar in design to that described in FIGS. 7A and 7B except that pressure sensor 220 is directly coupled to one or more test orifices 280. As shown in FIG. 9A, a test conduit 270 is formed within an extension 272 of gas inject plate 212 and, optionally, a vacuum seal is achieved between an upper surface 274 of extension 272 and a lower surface 276 of gas injection assembly body 210 using an (elastomer) O-ring 278. Alternately, as shown in FIG. 9B, a test conduit 270 is formed within an extension 290 of gas injection assembly body 210.

Figure 10:
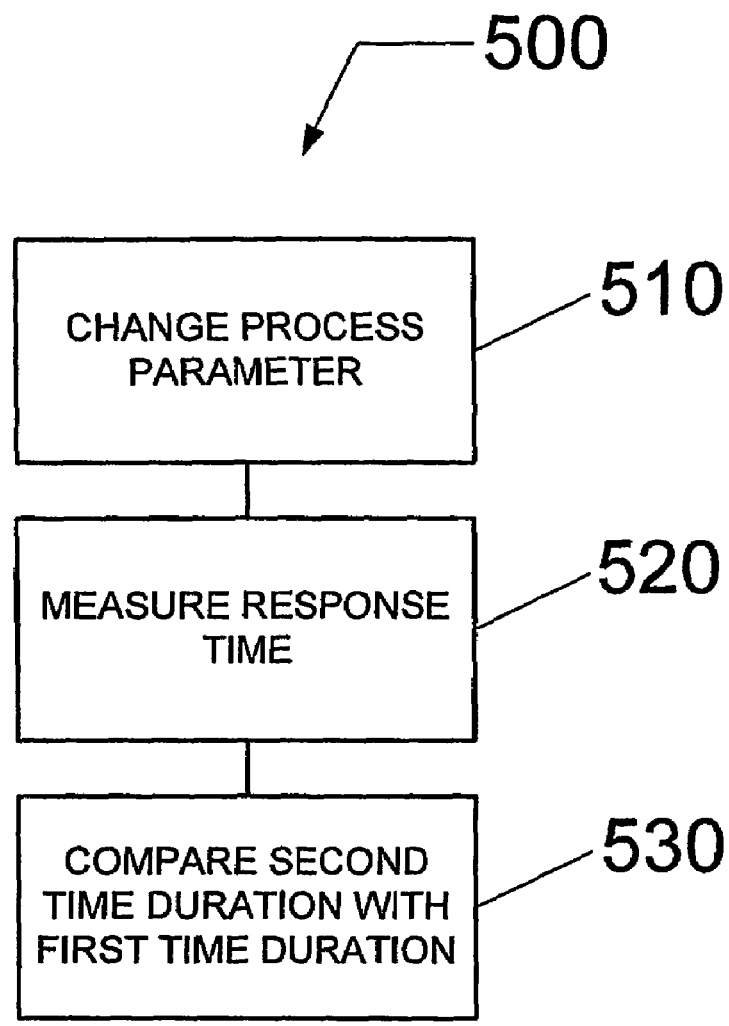
FIG. 10 presents a method of determining a consumable lifetime for a gas injection component in accordance with an embodiment of the present invention.

FIG. 10 presents a method of determining the lifetime of a consumable by monitoring the gas injection pressure. For example, the consumable can comprise the consumable gas inject plate as described in FIGS. 2 through 9B. A procedure 500 begins in step 510 with facilitating a change in a process parameter. The process parameter comprises at least one of a processing pressure in the plasma processing chamber of the plasma processing device, and a mass flow rate of the process gas coupled to the plasma processing chamber of the plasma processing device. The change in the process parameter can be imposed, for example, by: changing the mass flow rate from one processing step to another processing step, changing the processing pressure from one processing step to another processing step, initiating a mass flow rate of process gas following the loading of a new substrate, or reducing the processing pressure following the loading of a new substrate and preceding the initiation of the mass flow rate of process gas.

In step 520, a response time is determined from a time trace of the gas injection pressure measured using the pressure sensor coupled to the gas injection system, or an nth derivative of the respective time trace. When the one or more orifices of the consumable gas inject plate correspond to a non-eroded state, the response time exhibits a first time delay $\Delta t_A$ in a first time trace. For example, the consumable gas inject plate has not been eroded when it is either first installed or replaced, and it has yet to be exposed to an erosive environment, such as plasma. When the one or more orifices of the consumable gas inject plate correspond to an eroded state, the response time exhibits a second time delay $\Delta t_B$ in a second time trace. For example, the consumable gas inject plate has been eroded once it is exposed to an erosive environment, such as plasma, during the processing of one or more substrates in the plasma processing device.

In step 530, the measured response time is compared to the first time delay to determine the state of the consumable gas inject plate of the gas injection system. In general, if one or more orifices of the consumable gas inject plate erode, the measured response time is less than the first time delay. In one embodiment, the state of the consumable gas inject plate comprises a partially eroded state when the measured response time ranges from 25% to 75% of the first time delay. For example, a partially eroded state can require notification of an operator and a recommendation for replacement of the consumable gas inject plate. In another embodiment, the state of the consumable gas inject plate comprises a fully eroded state when the measured response time is less than 25% of the first time delay. (This lower threshold can be considered as a second delay time against which the measured response time can be compared.) For example, a fully eroded state can require immediate notification of an operator and replacement of the consumable gas inject plate.

In an alternate embodiment, a first response time can be measured for a first location on the consumable gas inject plate, and a second response time can be measured for a second location on the consumable gas inject plate. For example, the first location can comprise at least one orifice proximate the center of the consumable gas inject plate, and the second location can comprise at least one orifice proximate the edge of the consumable gas inject plate. The first and second measured response times can be utilized to determine a uniformity of the process for each substrate processed. The resultant uniformity can be monitored from run-to-run, or batch-to-batch, to ensure that the process is performed within acceptable ranges. When a deviation in the process uniformity exceeds a pre-determined threshold, the operator can be notified for system maintenance.

Although only certain exemplary embodiments of this invention have been described in detail above, those skilled in the art will readily appreciate that many modifications are possible in the exemplary embodiments without materially departing from the novel teachings and advantages of this invention. Accordingly, all such modifications are intended to be included within the scope of this invention.

What is claimed is:

1. A method of determining the state of a gas injection system in a plasma processing device comprising:
    changing a process parameter in said plasma processing device to affect a change of a gas injection pressure in said gas injection system, said gas injection system comprising a gas injection assembly body configured to receive a process gas from at least one mass flow controller, a consumable gas inject plate coupled to said gas injection assembly body, said consumable gas inject plate comprising at least one orifice to distribute said process gas to said plasma processing device, a pressure sensor coupled to said gas injection system, and a controller coupled to said pressure sensor;
    measuring a response time corresponding to a change of said gas injection pressure using said pressure sensor, wherein said response time corresponds to a first time delay when said consumable gas inject plate exhibits a non-eroded state and said response time corresponds to a second time delay when said consumable gas inject plate exhibits an eroded state; and
    comparing said response time with said first time delay in order to determine said state of said gas injection system.

2. The method recited in claim 1, further comprising a gas inject plate between said gas injection assembly body and said consumable gas inject plate.

3. The method recited in claim 1, wherein said consumable gas inject plate comprises one of silicon, carbon, silicon carbide, quartz, alumina, and coated metal.

4. The method as recited in claim 1, wherein said process parameter comprises at least one of a processing pressure in said plasma processing device and a mass flow rate of said process gas.

5. The method as recited in claim 1, wherein said first time delay is greater than said second time delay.

6. The method as recited in claim 1, wherein said state of said consumable gas inject plate is determined by a comparison of said response time to a fraction of said first time delay.

7. The gas injection system as recited in claim 1, wherein said state of said gas injection system comprises a partially eroded state when said response time ranges from 25% to 75% of said first time delay.

8. The gas injection system as recited in claim 1, wherein said state of said gas injection system comprises a fully eroded state when said response time is less than 25% of said first time delay.

* * * * *